(12) United States Patent
Zhao et al.

(10) Patent No.: US 9,689,919 B2
(45) Date of Patent: Jun. 27, 2017

(54) METHOD AND APPARATUS FOR TESTING MEMORY

(71) Applicants: Yunwu Zhao, Tianjin (CN); Hao Wang, Tianjin (CN)

(72) Inventors: Yunwu Zhao, Tianjin (CN); Hao Wang, Tianjin (CN)

(73) Assignee: NXP USA, INC., Austin, TX (US)

( * ) Notice: Subject to any disclaimer, the term of this patent is extended or adjusted under 35 U.S.C. 154(b) by 349 days.

(21) Appl. No.: 14/556,228

(22) Filed: Nov. 30, 2014

(65) Prior Publication Data
US 2016/0111170 A1 Apr. 21, 2016

(30) Foreign Application Priority Data

Oct. 16, 2014 (CN) .......................... 2014 1 0546844

(51) Int. Cl.
G11C 29/00 (2006.01)
G01R 31/30 (2006.01)
G01R 31/3177 (2006.01)
G11C 29/26 (2006.01)
G11C 29/50 (2006.01)
G11C 11/41 (2006.01)

(52) U.S. Cl.
CPC .......... *G01R 31/3177* (2013.01); *G11C 29/26* (2013.01); *G11C 29/50016* (2013.01); *G11C 11/41* (2013.01)

(58) Field of Classification Search
CPC ........ G01R 31/3177; G01R 31/318594; G01R 31/318335; G11C 29/29; G11C 29/50016; G11C 29/48; G11C 11/41; G11C 29/26; G11C 29/50; G11C 29/08; G11C 11/401
USPC .......................................... 714/718, 721, 745
See application file for complete search history.

(56) References Cited

U.S. PATENT DOCUMENTS

| 5,175,494 A * | 12/1992 | Yoshimori ..... G01B 31/318335 324/73.1 |
| 5,592,493 A | 1/1997 | Crouch et al. |
| 5,761,215 A | 6/1998 | McCarthy et al. |
| 6,574,762 B1 | 6/2003 | Karimi et al. |
| 7,010,732 B2 * | 3/2006 | Firth ...................... G11C 29/48 365/201 |
| 7,340,658 B2 | 3/2008 | Seuring |
| 7,805,644 B2 | 9/2010 | Damodaran et al. |
| 2003/0145264 A1* | 7/2003 | Siegel ............ G01R 31/318594 714/726 |
| 2004/0083412 A1 | 4/2004 | Corbin et al. |

* cited by examiner

Primary Examiner — Christine Tu
(74) Attorney, Agent, or Firm — Charles E. Bergere

(57) ABSTRACT

In an integrated circuit, a first scan chain of flip-flops is loaded with data for testing data retention of the flip-flops and a memory is loaded with data for performing a retention test by a memory built-in self-test (MBIST) wrapper circuit. A portion of the system is placed in a low-power state for a predetermined period of time before data is read from the memory and retention of data by the memory while in the low-power state is determined.

16 Claims, 3 Drawing Sheets

METHOD AND APPARATUS FOR TESTING MEMORY

BACKGROUND OF THE INVENTION

The present invention relates generally to integrated circuits including internal memory and, more particularly, to methods and apparatus for testing memory in a low power state.

In order to test an operation of a memory device, such as an SRAM, it is known to perform a retention test in which data is written to the memory device and, after a period of waiting, is read back from the memory and verified as being consistent with that initially written to the memory device.

Integrated circuits may be operated in a low leakage mode, such as a low leakage stop (LLS) mode in which a clock for at least a part of the circuit is stopped. The supply of power to parts of the circuit may also be reduced.

A retention test may be performed on the memory device in the stop mode. However such testing may not be indicative of actual operating conditions in the stop mode since at least some inputs to the memory device may still be powered during the testing, which is not indicative of conditions during the actual stop mode. Accordingly, it would be advantageous to be able to test memory retention under actual conditions for various modes of operation.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
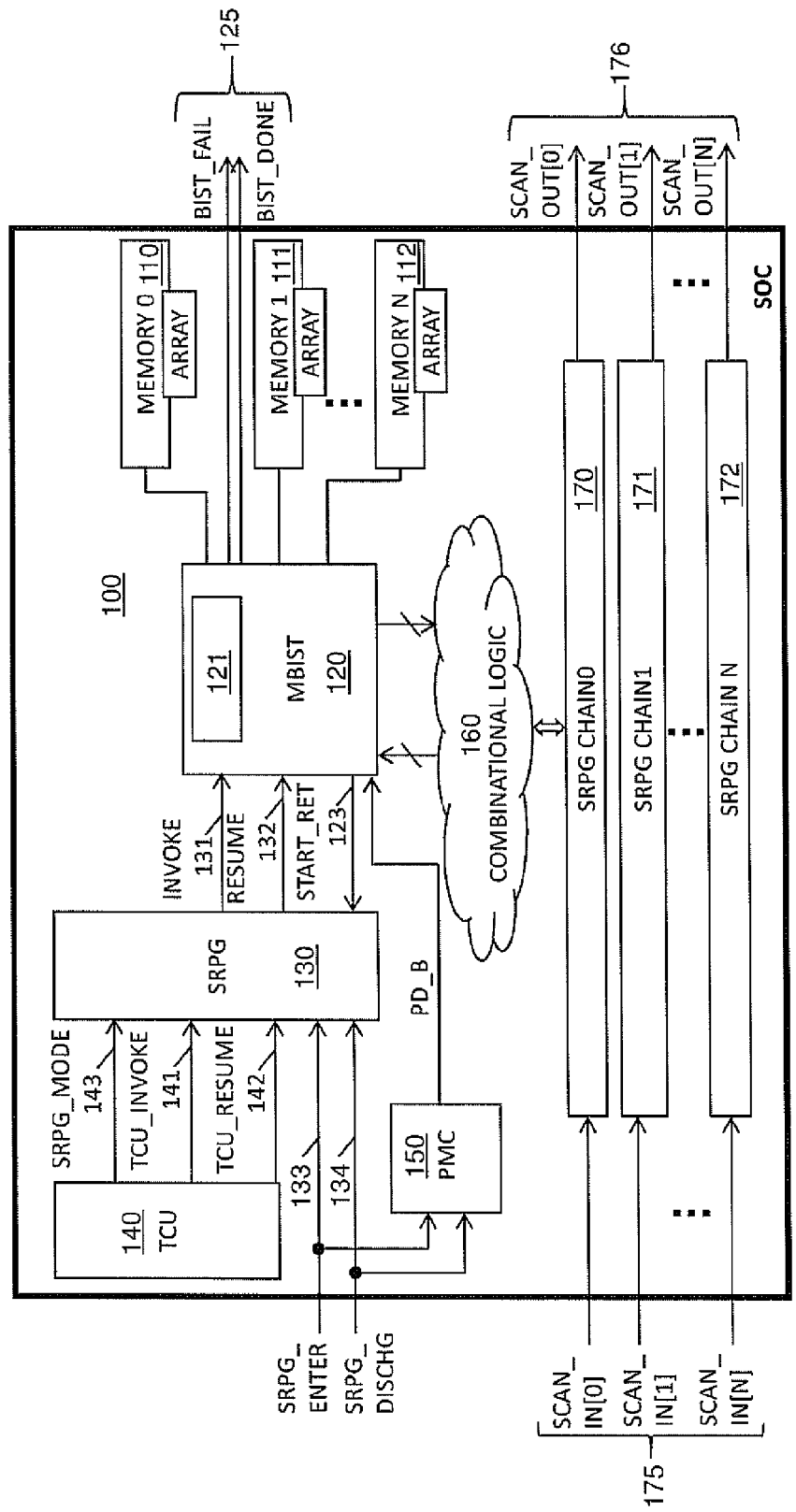
FIG. 1 is a schematic block diagram of a system according to an embodiment of the present invention.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a method and apparatus for testing a memory of an integrated circuit while the memory is in a low power state. In this way the memory is tested under more realistic operating conditions. Furthermore, the testing time is not substantially increased.

In order to test an integrated circuit, such as a system on chip (SoC), the circuit includes at least one scan chain. The test may be performed as a manufacturing test to test logic cells of the circuit to detect manufacturing defects. The scan chain is a chain of flip-flops that are used to store data for initializing at least a portion of logic in the circuit to a known state. The data indicative of the known state is entered or loaded into the scan chain when a scan test mode is entered. The data in the scan chain is used to apply a stimulus to the logic of the circuit. During a capture phase of the scan test a state of the logic is captured by the scan chain. During a read or unload phase the captured values are shifted out of the scan chain in order to validate the system, or part thereof, being tested. Based on the output of the scan chain the system may be verified, such as being verified as free of manufacturing defects. Hereinafter the scan test is referred to as a normal scan mode.

In embodiments of the invention an integrated circuit is operable in the normal test mode, such as when the system is undergoing a manufacturing test, using at least one scan chain. The scan test using the scan chain is performed under normal operating conditions, where the system is operable at a substantially normal operating voltage. The system further comprises a low power test mode in which some retention elements, such as flip-flops, forming a part of the scan chain used in the normal scan mode, form part of memory test circuitry for testing a memory of the system while in the low power mode. A scan chain for use in the low power test mode is formed by some of the retention elements used in the normal scan mode. The memory is tested for data retention in the low power mode simultaneously with the remaining retention elements being tested for data retention in the low power mode.

Referring now to FIG. 1, a schematic diagram of a circuit or system 100 according to an embodiment of the invention is shown. The system 100 may be a system on chip (SoC). The system 100 comprises one or more memory units 110, 111, 112, memory built-in test (MBIST) wrapper circuitry 120, a state retention power gating (SRPG) control unit 130, a test control unit (TCU) 140, a power management control (PMC) unit 150, combinational logic 160 and one or more scan chains 170, 171, 172. As is understood by those of skill in the art, a scan chain comprises a plurality of series connected flip-flops.

As described above, in a first test mode, namely the normal scan mode, the one or more scan chains of flip-flops (FFs) 170, 171, 172 are loaded with data via a respective input 175 to each scan chain 170, 171, 172. The one or more scan chains 170, 171, 172 are formed by flip-flops within the system 100, including flip-flops within the MBIST wrapper circuitry 120. The data loaded into the scan chains are provided to the combinational logic 160 for the purpose of detecting defects in the system 100. Following the test, the output of the combinational logic 160 is stored in the scan chains 170, 172, 171 and is read or unloaded therefrom via a respective output 176 of each scan chain 170, 171, 172. In this way defects in the system 100 may be detected.

The memory units 110, 111, 112 are provided for storing data in the system 100. The memory units 110, 111, 112 may be SRAM memory units 110, 111, 112. Although FIG. 1 shows the system comprising three memory units 110, 111, 112, it will be realized that this is merely illustrative and other numbers of memory units may be included in the system 100. Each memory unit 110, 111, 112 comprises an array of memory cells for storing data therein.

The MBIST wrapper circuitry 120 is arranged to test operation of at least one, or all, of the memory units 110, 111, 112. For example, the MBIST wrapper circuitry 120 is arranged to test the operation of memory unit 110 for data retention when at least one input is at a low voltage. The MBIST wrapper circuitry 120 may also test operation of the memory unit 110 in the normal operating voltage mode of the system 100. The MBIST wrapper circuitry 120 is further arranged to test operation of the memory unit 110 while the system is operative in a low-power mode, which may be known as low-leakage stop (LLS) mode. The low-power mode is a mode in which a portion of the system 100 is operative at a reduced voltage. In the low-power mode a clock signal to at least a portion of the system 100 may be stopped.

In the low-power mode an operating voltage of the portion of the system 100 is reduced, such as to substantially 0 Volts, while the operating voltage of retention elements, such as flip-flops, of the system 100 is maintained to retain state information therein. While in the low-power mode a scan test may be performed to test operation of the retention elements of the system 100. The scan test performed in the low-power mode may be a state retention power gating (SRPG) scan test. SRPG is a mode wherein power to logic is reduced while being maintained to retention elements such as flip-flops. In particular the scan test is performed to test the retention of data by the retention elements in the low-power mode. In the low-power scan test the one or more scan chains 170, 171, 172 are loaded with data via the input 175 and it is tested whether the one or more scan chains 170, 171, 172 retain the data while the system is operative in the low-power mode. The retention may be tested while in the SRPG mode.

The MBIST wrapper circuitry 120 comprises logic 121 that is arranged to test a retention of data in the memory units 110, 111, 112 while the low-power scan test is being performed. Advantageously this allows the retention of data by the memory unit 110 to be tested while other logic of the system 100, such as the combinational logic 160, is in the low power state, thereby providing a more realistic test of the operation of the memory unit 110. Furthermore, the test of the memory unit 110 is performed simultaneously with a test of retention elements of the system 100, such as flip-flops which reduces a testing time of the system 100.

Figure 2:
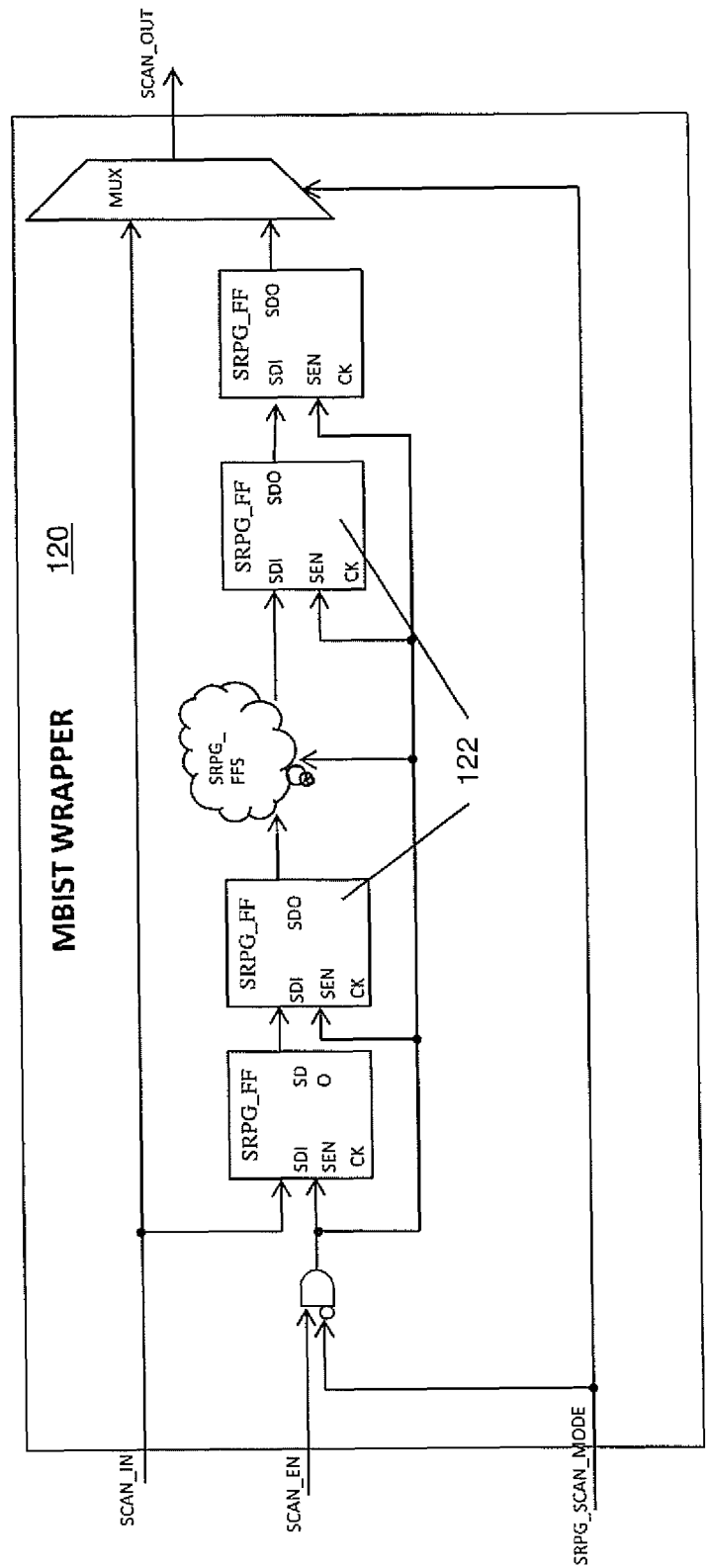
FIG. 2 is a memory built in self-test wrapper according to an embodiment of the present invention.

FIG. 2 is a schematic block diagram of the MBIST wrapper circuitry 120, which includes a plurality of flip-flops 122. The flip-flops 122 are configured in the first, normal scan mode, to form a scan chain while other flip-flops outside the MBIST wrapper circuitry 120 form further scan chains, or as part of a scan chain including flip-flops outside of the MBIST wrapper circuitry 120. The flip-flops 122 may be used in the normal scan mode to test the combinational logic 160, as previously described. In the low-power scan mode at least some flip-flops 122 of the MBIST wrapper circuitry 120 are excluded from the scan chain(s) 170, 171, 172. The flip-flops 122 of the MBIST wrapper circuitry 120 are used in the low-power scan mode to provide a retention test of the memory units 110, 111, 112.

The SRPG control unit 130 controls the MBIST wrapper circuitry 120 in the low-power scan mode. In particular the SRPG control unit 130 invokes the MBIST wrapper circuitry 120 when the low-power scan test is executed and resumes operation of the MBIST wrapper circuitry 120 after a predetermined period of time during which retention of data in the memory units 110, 111, 112 is tested in the low-power mode with the low operating voltage.

The TCU 140 controls testing of the memory units 110, 111, 112. The TCU 140 controls the MBIST wrapper circuitry 120 in the normal operating mode, when the system 100 is operative at a normal operating voltage, to test operation of the memory units 110, 111, 112.

As shown in FIG. 2, the TCU 140 may provide first and second inputs TCU_invoke 141 and TCU_resume 142 to the MBIST wrapper circuitry 120 to invoke and resume operation of the MBIST wrapper circuitry 120, respectively, in the normal operating mode. Although these inputs are provided to the SRPG control unit 130 in FIG. 1 they may be considered to bypass the SRPG control unit 130 to control the MBSIT wrapper circuitry 120 via inputs invoke 131 and resume 132 provided to the MBIST wrapper circuitry 120 from the SRPG control unit 130. Furthermore, the TCU 140 provides a further input, namely a SRPG_mode input 143 to the SRPG control 130 that is indicative of the system 100 executing the low-power scan test. In the low-power scan test the SRPG control unit 130 is arranged to control the invoke 131 and resume 132 inputs to the MBIST wrapper circuitry 120. It will be realized that the various inputs and outputs between units may be arranged differently in other embodiments of the invention.

The PMC unit 150 is provided for controlling an operating voltage of the system 100. The PMC unit 150 and the SRPG control unit 130 receive a SRPG_enter 133 input indicative of the system entering the low-power mode. The PMC unit 150 and the SRPG control unit 130 further receive a SRPG_discharge input 134 that is validly activated when in the SRPG mode. In response to the SRPG_dischg input 134, the PMC 150 discharges or reduces the operating voltage of a portion of the system 100, for example to substantially 0 Volts. The SRPG control unit 130 receives an input scan_en 135 that is indicative of loading or unloading of data from/to one or more of the SRPG scan chains 170, 171, 172. Data is loaded into the SRPG scan chains 170, 171, 172 via the inputs 175 and unloaded or read via the outputs 176.

The MBSIT wrapper circuitry 120 provides a start_ret output 123 to the SRPG control unit 130 which is indicative of the retention test of the memory units 110, 111, 112 being completed.

Figure 3:
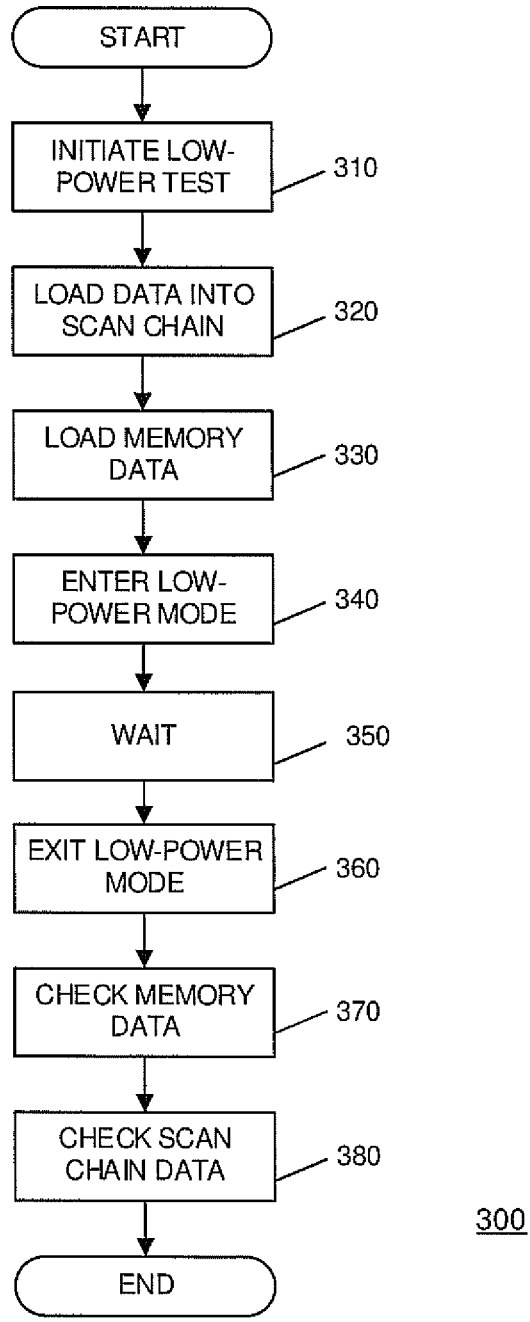
FIG. 3 is a flow chart of a method according to an embodiment of the present invention.

FIG. 3 illustrates a method 300 according to an embodiment of the invention that may be implemented in a system 100 as illustrated in FIG. 1. Prior to the method 300 being executed the system 100 is operable with a normal operating voltage.

In step 310 a low-power test of the system 100 such as a SRPG scan test is initiated. The TCU 140 may provide an output on the SRPG_mode 143 signal line indicative of the SRPG scan test being initiated.

In step 320 scan data is loaded into one or more scan chains of the system 100. The scan data may be loaded into the one or more SRPG scan chains 170, 171, 172. The scan data may be loaded into each of the scan chains 170, 171, 172 by providing data to the respective input 175 and clocking the data into the scan chain 170, 171, 172, as will be appreciated.

In step 330, which may be performed at least partly in parallel with step 320, a retention test of one or more memories of the system such as memory 110 is begun. Step 330 may comprise the SRPG unit 130 activating the invoke input 131 to the MBIST wrapper circuitry 120. In response the MBIST wrapper circuitry 120 loads the memory 110 with predetermined retention test data. The retention test data may form a predetermined pattern in the memory, such as a checkerboard pattern, for testing the memory 110.

In step 340 once the SRPG chains 170, 171, 172 have been loaded with the scan data and the retention test data has been stored in the memory 110, the system 100 enters the low-power mode. In particular the system may enter the SRPG mode. In step 340 the SRPG_enter input 133 may be asserted. In response thereto the PMC 150 causes the system to enter the low-power mode. In some embodiments, after a predetermined period of time, the operating voltage of a portion of the system is reduced, such as to substantially 0 volts. In one embodiment after the predetermined period of time, which may be 5 μs, the SRPG_dischg input 134 is asserted cause the operating voltage to be reduced. The operating voltage is reduced to at least combinatorial logic 160 of the system 100.

In step 350 a predetermined period of time is allowed to elapse during which retention of the retention data by the memory 110, and storage of the scan data by the one or more scan chains 170, 171, 172 is tested. The duration of time that is allowed to elapse in step 350 may be the longer of a memory retention requirement or a scan chain storage requirement.

In step 360 the low-power mode is exited by the system 100. The low-power mode may be exited by de-asserting the SRPG_dischg input 134. Following the de-assertion a predetermined period of time such as 1 μs may be allowed to elapse to allow a supply voltage to rise. Following the period of time the SRPG_enter input 133 may be de-asserted to leave the low-power mode. Following the de-assertion a predetermined period of time, such as 5 μs, may be allowed to elapse to ensure a robust switch between power modes.

In step 370 the retention of data by the memory 110 is checked. The retention of data may be checked by retrieving at least some of the retention test data stored in the memory 110 and comparing the retrieved data with that previously stored. If the retrieved data matches that previously stored then the retention test is passed.

In step 380, which may be performed at least partly in parallel with step 370, the data in the one or more scan chains 170, 171, 172 is checked. The data may be checked by unloading the data from the scan chains 170, 171, 172 via the outputs 176 and comparing the unloaded data with the previously stored scan data. If the unloaded data matches that previously stored then the scan test is passed. The MBIST wrapper circuitry 120 may provide at least one output 125 indicative of the memory test being completed, such as Bist_done shown in FIG. 1, and an output indicative of failure of the retention test, such as Bist_fail.

Advantageously, the present invention enables testing a one or more memory units while other system components are operating in a low power state, thereby providing a more realistic test environment. In particular retention of data by the one or more units is tested while inputs to the memory from combinational logic are at a low voltage Furthermore a testing time of the system may be reduced. Testing time is reduced by testing the memory units while retention of data by one or more scan chains or flip-flops is tested.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A method of testing operation of a memory of an integrated circuit, comprising:
    loading flip-flops of a first scan chain with first data for testing data retention of the flip-flops;
    loading the memory with second data for performing a retention test by a memory built-in self-test (MBIST) wrapper circuit;
    placing at least a portion of the integrated circuit and the memory in a low-power state for a predetermined period of time;
    reading the second data from the memory; and
    determining retention of the second data by the memory in the low-power state based on the read second data.

2. The method of claim 1, comprising:
    loading the first scan chain and flip-flops of a second scan chain associated with the MBIST wrapper circuit with third data;
    initializing a logic portion of the integrated circuit to a known state based on the third data in the first and second scan chains;
    testing the logic portion of the integrated circuit in a normal power mode based on the third data in the first and second scan chains.

3. The method of claim 1, further comprising unloading the first data from the first scan chain and verifying data storage by the first scan chain based on the unloaded data.

4. The method of claim 1, further comprising outputting a signal, wherein the signal is indicative of correct data retention by the memory when the read second data is consistent with the second data loaded into the memory.

5. The method of claim 1, wherein the low power mode is a low leakage stop mode.

6. The method of claim 1, wherein in the low power mode, a clock to the logic portion of the integrated circuit is stopped.

7. The method of claim 1, wherein the low power mode is a state retention power gating (SRPG) mode.

8. The method of claim 1, wherein the predetermined period of time is a greater of a flip-flop data retention requirement and a memory retention requirement.

9. A system, comprising:
    a memory for storing data;
    a memory built-in self-test (MBIST) wrapper circuit coupled to the memory for testing operation of the memory, wherein the MBIST wrapper circuit provides retention data to the memory for storage in the memory;
    a scan chain of flip-flops having an input and an output, wherein the scan chain receives scan data via the input and stores the scan data in the flip-flops;
    combinational logic coupled to the memory, wherein the flip-flops of the scan chain comprise a part of the combinational logic; and
    a power management control (PMC) unit for controlling an operating voltage of the combinational logic,
    wherein the PMC unit initiates a low-power mode in which the operating voltage of the combinational logic is reduced for a predetermined period of time, and the MBIST wrapper circuit reads the retention data from the memory and determines retention of data by the memory based on the read retention data.

10. The system of claim 9, wherein the MBIST wrapper circuit comprises a plurality of second flip-flops arranged to form a second scan chain for initializing the combinational logic in a scan test mode.

11. The system of claim 10, wherein the scan test mode is performed at a system operating voltage.

12. The system of claim 9, further comprising a state retention power gating (SRPG) unit coupled to the combinational logic and arranged to test retention of data stored in the scan chain in the low-power mode.

13. The system of claim 9, wherein the MBIST wrapper circuit outputs a signal, wherein the signal is indicative of correct retention of data by the memory in the low-power mode.

14. The system of claim 9, wherein testing the retention of data by both the memory and the scan chain are performed simultaneously with in the low-power mode.

15. The system of claim 9, wherein the low-power mode is a state retention power gating (SRPG) mode.

16. An integrated circuit, comprising:
a memory for storing data;
a memory test unit coupled to the memory for testing an operation of the memory;
a plurality of flip-flops connected together into a serial scan chain;
a power management control unit (PMCU) for controlling an operating voltage of the integrated circuit; and
a test control unit (TCU) connected to the scan chain for loading scan data into the scan chain, and connected to the memory test unit for causing the memory test unit to load retention data into the memory for a memory retention test,
wherein the PMCU reduces the operating voltage of both a logic portion of the integrated circuit that includes the scan chain, and the memory, for a predetermined period of time, and
wherein the TCU determines the retention of the retention data stored in the memory and the retention of the scan data stored in the flip-flops of the scan chain, after the reduction in the operating voltage.

\* \* \* \* \*